United States Patent
Hirano et al.

(10) Patent No.: US 7,686,973 B2
(45) Date of Patent: Mar. 30, 2010

(54) SILICON WAFER ETCHING METHOD AND APPARATUS, AND IMPURITY ANALYSIS METHOD

(75) Inventors: Katsuya Hirano, Kishima-gun (JP); Hiroshi Horie, Saga (JP)

(73) Assignee: Sumitomo Mitsubishi Silicon Corporation, Tokyo (JP)

( * ) Notice: Subject to any disclaimer, the term of this patent is extended or adjusted under 35 U.S.C. 154(b) by 463 days.

(21) Appl. No.: 11/739,498

(22) Filed: Apr. 24, 2007

(65) Prior Publication Data

US 2008/0047934 A1   Feb. 28, 2008

Related U.S. Application Data

(63) Continuation-in-part of application No. 10/489,763, filed as application No. PCT/JP02/10904 on Oct. 21, 2002, now abandoned.

(30) Foreign Application Priority Data

Oct. 24, 2001 (JP) .............................. 2001-325863

(51) Int. Cl.
 *C23F 1/00* (2006.01)
(52) U.S. Cl. .............................. 216/84; 216/90; 216/99; 257/E21.219
(58) Field of Classification Search ........................ None
See application file for complete search history.

(56) References Cited

U.S. PATENT DOCUMENTS

| 4,971,654 | A | | 11/1990 | Schnegg et al. | |
|---|---|---|---|---|---|
| 5,271,798 | A | * | 12/1993 | Sandhu et al. | 438/745 |
| 5,395,482 | A | * | 3/1995 | Onda et al. | 216/73 |
| 5,423,944 | A | | 6/1995 | Wong | |
| 5,849,597 | A | * | 12/1998 | Tokuoka et al. | 436/175 |
| 5,851,303 | A | * | 12/1998 | Hwang et al. | 134/3 |

(Continued)

FOREIGN PATENT DOCUMENTS

EP   0750336 A2   12/1996

(Continued)

OTHER PUBLICATIONS

Patent Abstracts of Japan for JP2001-194362 published on Jul. 19, 2001.

(Continued)

*Primary Examiner*—Allan Olsen
(74) *Attorney, Agent, or Firm*—Darby & Darby P.C.

(57) ABSTRACT

A wafer etching and impurity analysis method is presented in which a wafer is held in a vessel having gas introduction and exhaust ports, a solution including a mixture of hydrofluoric acid and nitric acid alone or together with sulfuric acid is bubbled with a carrier gas without being heated, which generates a gas containing vaporized hydrofluoric acid and nitric acid, and the inside of the vessel is purged so that the amount of gas supplied is kept constant at all times. All or a specific portion of the wafer is cooled to a specific temperature. Consequently, the gas is condensed on the surface of the wafer, which allows the required portion of the wafer to be etched. The method reduces the amount of liquid needed for residue recovery, the amount of admixed silicon during impurity analysis, and the concentration time.

10 Claims, 7 Drawing Sheets

U.S. PATENT DOCUMENTS

| | | | |
|---|---|---|---|
| 5,916,824 A * | 6/1999 | Mayuzumi et al. | 438/753 |
| 6,290,863 B1 * | 9/2001 | Morgan et al. | 216/73 |
| 6,995,834 B2 * | 2/2006 | Shabani et al. | 356/36 |
| 7,182,821 B2 * | 2/2007 | Izumi et al. | 134/36 |
| 7,583,358 B2 * | 9/2009 | Benson | 355/53 |
| 2005/0178503 A1 * | 8/2005 | Okamoto | 156/345.17 |

FOREIGN PATENT DOCUMENTS

| | | |
|---|---|---|
| JP | 03-188642 A1 | 8/1991 |
| JP | 06-213805 A1 | 8/1994 |
| JP | 8-330271 A | 12/1996 |
| JP | 11-102891 A1 | 4/1999 |
| JP | 11-111600 A1 | 4/1999 |
| JP | 2001-194362 A1 | 7/2001 |
| WO | WO-99/12026 A1 | 3/1999 |

OTHER PUBLICATIONS

Patent Abstracts of Japan for JP03-1888642 published on Aug. 16, 1991.

Patent Abstracts of Japan for JP06-213805 published on Aug. 5, 1994.

Patent Abstracts of Japan for JP11-111600 published on Apr. 23, 1999.

Patent Abstracts of Japan for JP11-102891 published on Apr. 13, 1999.

* cited by examiner

SILICON WAFER ETCHING METHOD AND APPARATUS, AND IMPURITY ANALYSIS METHOD

CROSS-REFERENCES TO RELATED APPLICATIONS

This application is a continuation-in-part of U.S. patent application Ser. No. 10/489,763, filed Mar. 11, 2004, which is a U.S. national phase application under 35 U.S.C. §371 of International Patent Application No. PCT/JP02/10904 filed Oct. 21, 2002, and claims the benefit of Japanese Patent Application No. 2001-325863 filed Oct. 24, 2001. The International Application was published in Japanese on May 1, 2003 as WO 03/036706 A1 under PCT Article 21(2). All of the aforementioned documents are incorporated herein by reference.

FIELD OF THE INVENTION

This invention relates to an etching method with which a recovered solution of decomposition residue after a silicon wafer surface has been etched is analyzed and the metal impurities contained in the silicon wafer are quantitatively analyzed. The invention further relates to an etching method and apparatus and an impurity analysis method. The method produces an amount of in-plane etching that is uniform, and there is little contamination during the concentration of the recovered solution. Therefore, a high-precision and high-sensitivity analysis is possible.

BACKGROUND OF THE INVENTION

As devices have become smaller and the level of integration has risen, it has become increasingly important in the field of semiconductor manufacturing to reduce the amount of metal impurities present in a silicon wafer, as these impurities can markedly diminish the performance of a device.

Also, since some silicon wafers ($p^+$ wafers) cannot be evaluated from their electrical characteristics, there has been a need for a high-precision and high-sensitivity chemical analysis method. Methods for evaluating the metal impurities in a silicon wafer by chemical analysis include a direct dissolution process, a sandwich process, and an indirect dissolution process.

Direct dissolution is a method in which a chemical is dropped onto a silicon wafer and the wafer is directly dissolved in the chemical, such as by dropping hydrofluoric acid and nitric acid onto a silicon wafer, etching, and recovering these acids. A sandwich process involves dropping hydrofluoric acid and nitric acid onto a base surface, placing a silicon wafer over this, and then etching and recovering these acids. Indirect dissolution is a method in which hydrofluoric acid and nitric acid are heated, a silicon wafer is etched with the gas generated by this heating, and the subsequent decomposition residue is recovered with a chemical.

To concentrate the recovered solution, a suitable amount of aqua regia, sulfuric acid, or the like is mixed into the recovered solution, and a hot plate, microwaves, or the like is used for concentration. Analysis is performed by atomic absorption spectrometry (AAS), inductively coupled plasma-mass spectrometry (ICP-MS), or the like.

However, with direct dissolution, the liquid is dropped over the entire surface of the silicon wafer, so a large amount of chemical must be used, metal impurities present in the chemical itself pose a substantial background to the analysis values, and the metal impurities in the sample cannot be analyzed to a high degree of sensitivity.

With a sandwich process, a silicon wafer is placed on drops of liquid, after which the wafer is slid aside and the liquid drops are recovered. With this method, very little liquid is dropped ((just several hundred microliters), so uniform in-plane etching is difficult, and there is considerable variance in the amount of etching from one silicon wafer to the next.

With indirect dissolution, a gas of hydrofluoric acid and nitric acid is generated at room temperature vaporization pressure or a vaporization pressure produced by heating, and this vapor is used for dissolution. Some of the problems with this method are that it is difficult to control the amount of gas generated, which affects the amount of etching of the silicon wafer and prevents uniform etching of the surface, and etching unevenness makes it difficult to recover the subsequent decomposition residue with a chemical.

In particular, an indirect dissolution method that has been proposed as a method for etching a silicon wafer surface layer or a method for analyzing metal impurities is a method in which a silicon wafer is held horizontally in a sealed vessel, nitric acid and hydrofluoric acid are put in separate vessels, each vessel is heated to produce separate gases of nitric acid and hydrofluoric acid, and the silicon wafer is cooled and its surface layer is etched (Japanese Laid-Open Patent Application H8-330271). A problem with this method, however, is that adequate etching performance cannot be achieved (approximately 0.1 µm/hr) because the nitric acid and hydrofluoric acid gases are supplied separately.

In another method that has been proposed, a silicon wafer is held upside-down by a vacuum chuck, nitric acid and hydrofluoric acid are put into the same vessel underneath this wafer and heated, the nitric acid and hydrofluoric acid gas thus generated etches the silicon wafer, and the condensed liquid on the wafer surface is recovered and subjected to atomic absorption spectrometry (Japanese Laid-Open Patent Application H6-213805).

A problem with this method, however, is that the nitric acid and hydrofluoric acid gas is generated by heating the vessel of the nitric acid and hydrofluoric acid, and it is difficult to control the amount of gas generated, which affects how much the silicon wafer is etched and prevents the surface from being etched uniformly.

In addition, there is a method in which the condensed liquid is analyzed directly with an atomic absorption spectrometer, but the condensed liquid contains a large HF and silicon component, which poses a substantial background during analysis, the peak shape for the sample becomes abnormal, etc., making quantitative analysis difficult.

Also, with conventional methods, because the metal impurities in decomposition residue are quantitatively analyzed by atomic absorption spectrometry or inductively coupled plasma-mass spectrometry, a large quantity of silicon is included in the recovered solution, and therefore has to be removed. In order to remove this silicon, it is dissolved in a mixture of aqua regia, sulfuric acid, or the like and concentrated.

However, since this concentration method involves the use of a large quantity of chemical, there is the danger that the metal impurities contained in the chemical will contaminate the concentrate, and there is also the possibility that long-term concentration will result in contamination from the atmosphere.

SUMMARY OF THE INVENTION

It is an object of the present invention to solve the above-mentioned problems encountered in etching by an indirect dissolution method, and to provide a method for etching a silicon wafer. With this method, the amount of in-plane etching can be uniform, and there is little contamination during the concentration of the recovered solution. Therefore, a high-precision and high-sensitivity analysis can be possible. It is a further object of the present invention to provide an apparatus used in the above-mentioned etching method, as well as an impurity analysis method that utilizes the above-mentioned etching method.

As a result of various studies aimed at achieving more uniform etching in an indirect dissolution process, the inventors discovered that the gas can be supplied in a constant quantity to control the etching process by holding a silicon wafer horizontally in a vessel (chamber) that has a gas introduction and exhaust system, bubbling a solution comprising a mixture of hydrofluoric acid and nitric acid, or of hydrofluoric acid, nitric acid, and sulfuric acid, with a carrier gas such as $N_2$ without being heated to generate a gas of hydrofluoric acid and nitric acid, and supplying this gas to the vessel to purge its inside.

Also, the inventors perfected the present invention by adjusting the hydrofluoric acid and nitric acid in an etching solution—which is bubbled with a carrier gas without being heated—to a specific molar ratio, and regulating the amount of gas by the above-mentioned means as the gas is introduced, and cooling all or a specific portion of the silicon wafer to between 0 and 20° C. to condense the gas on its surface. As a result, the required portion of the wafer can be etched, with a uniform amount of the required in-plane etching, so the wafer surface will have good smoothness after etching, the amount of recovery liquid can be reduced, and the amount of admixed silicon during impurity analysis, the concentration time, and so forth can be decreased.

Specifically, the present invention is directed to a silicon wafer etching method, wherein a carrier gas is bubbled through a mixed solution of hydrofluoric acid and nitric acid or of hydrofluoric acid, nitric acid, and sulfuric acid, the hydrofluoric acid and nitric acid gas thus generated is introduced into a vessel with a gas inlet and outlet, and released to the outside of the vessel, while condensing the gas on the surface of a cooled silicon wafer that is held horizontally inside the vessel, thereby etching the surface. The amount of etching is controlled by controlling the amount of gas introduced and released.

The invention is further directed to:

a method in which the mixed solution is composed of hydrofluoric acid and nitric acid, and the nitric acid is used in an amount of 0.351 to 2.805 mol per mole of hydrofluoric acid, a method in which the mixed solution is composed of hydrofluoric acid, nitric acid, and sulfuric acid, and the nitric acid is used in an amount of 0.351 to 2.805 mol and the sulfuric acid in an amount of 0.163 to 0.490 mol per mole of hydrofluoric acid, a method in which the cooling temperature of the silicon wafer is 0 to 20° C., a method in which the cooled portion of the silicon wafer is the entire wafer, the outer periphery of the wafer, the middle part of the wafer, or a specific part of the wafer, and a method in which the amount of etching is 0.02 to 10.0 µm.

The present invention also proposes an etching apparatus comprising means for generating an etching gas, a vessel having a gas introduction and exhaust system, and cooling and holding means for coolably holding a silicon wafer in the vessel.

Further, the present invention is directed to a method for analyzing the impurities of a silicon wafer, including an etching step of introducing a gas containing vaporized hydrofluoric acid and nitric acid, generated by bubbling a carrier gas through a mixed solution containing hydrofluoric acid and nitric acid, into a vessel having a system for introducing and exhausting said gas, and condensing the gas on the surface of a cooled silicon wafer held inside said vessel to etch the surface, a recovery step of recovering decomposition residue by scanning the entire surface of the etched wafer with a mixed solution of hydrofluoric acid and aqueous hydrogen peroxide, and an analysis step of concentrating the recovered solution and analyzing the metal impurities in said solution.

DETAILED DESCRIPTION OF THE INVENTION

The silicon wafer etching method pertaining to the present invention is characterized by the use of a vessel that allows the introduction and exhaust of gas, and is characterized in that a mixed solution of hydrofluoric acid and nitric acid is made into a gas by being bubbled with a carrier gas such as $N_2$ without being heated, the generated gas of hydrofluoric acid and nitric acid is introduced into the above-mentioned vessel and exhausted outside the vessel, a silicon wafer is held horizontally inside the vessel, the above-mentioned gas is condensed on the required portion of the silicon wafer surface which has been cooled to a specific temperature, thereby etching this surface, and the amount of etching is controlled by controlling the amount of gas introduced and exhausted.

Figure 1:
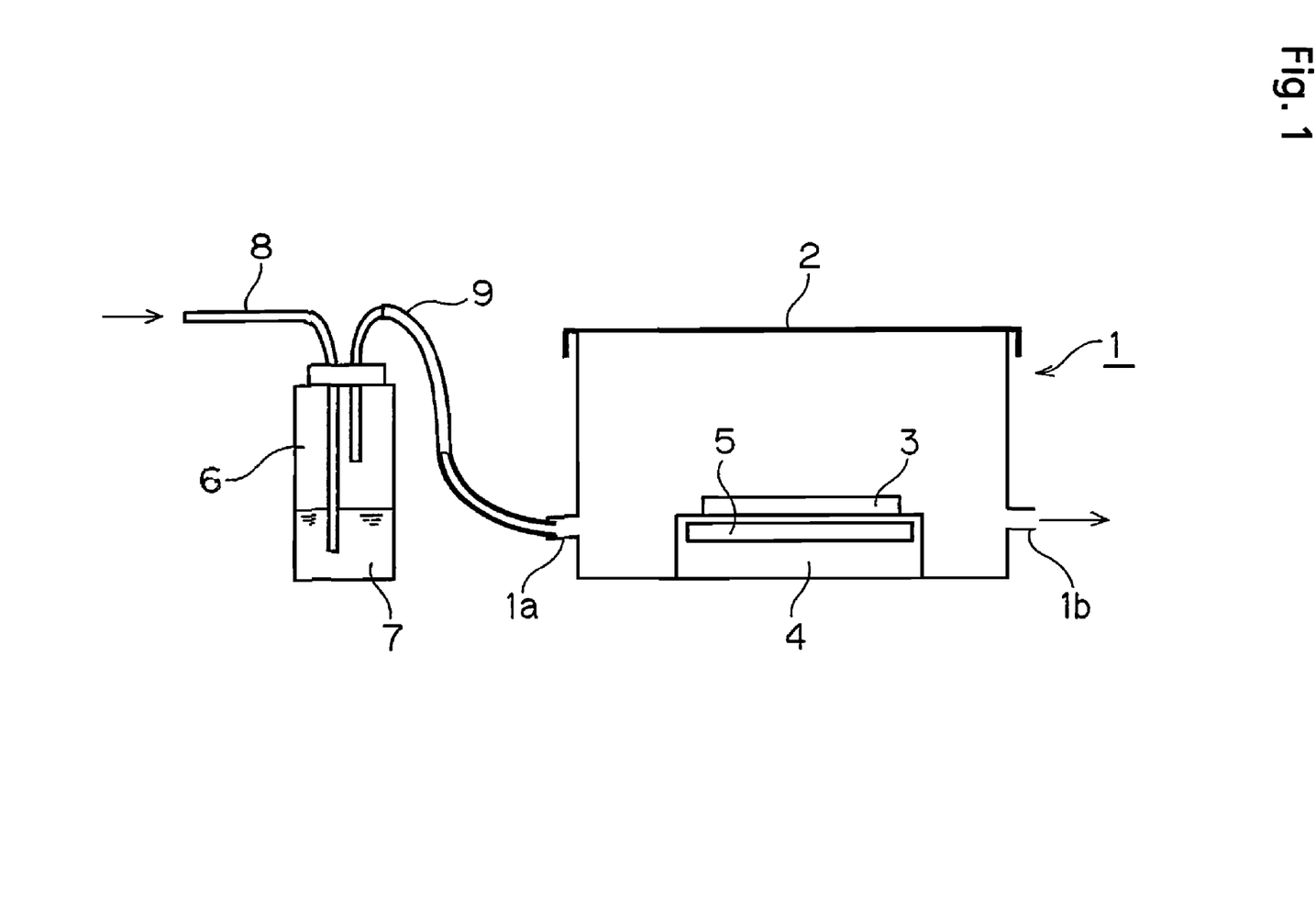
FIG. 1 is a diagram illustrating the simplified structure of the silicon wafer etching apparatus used in the present invention.

FIG. 1 shows an example of the apparatus for etching a silicon wafer pertaining to the present invention. A reaction vessel 1 has a lid 2 at the top, and a cooling apparatus 5 is built into a stage 4 used to hold a silicon wafer 3 horizontally inside the reaction vessel 1. An etching chemical container 6 is disposed on the outside of the reaction vessel 1, and a solution 7 comprising a mixture of a hydrofluoric acid solution and a nitric acid solution is contained in the chemical container 6. $N_2$ gas (used here as the carrier gas) is blown into the chemical container 6 through a bubbling pipe 8, the solution gas thus generated enters the reaction vessel 1 through an introduction pipe 9 and an introduction port 1a, and at the same time this gas is guided out of the reaction vessel 1 by an exhaust pump or the like through an exhaust port 1b.

Specifically, with a conventional method, the etching gas was generated by heating the solution used for etching, which was dangerous and also made it difficult to adjust the flow of etching gas, but with the present invention, the gas is generated merely by bubbling the solution 7, which is obtained by mixing etching-use hydrofluoric acid and nitric acid, with $N_2$ gas, without heating the solution 7, and is introduced into the reaction vessel 1 while being exhausted to the outside, so that a constant amount of gas is always supplied, which allows the etching gas to be supplied safely and in a precise constant amount.

The silicon wafer 3 is cooled by the cooling apparatus 5 on the stage 4, and the etching gas condenses on the cooled surface of the silicon wafer 3 and etches (decomposes) the silicon wafer 3. The following reactions occur in this etching.

$$Si + 4HNO_3[[\uparrow]] \rightarrow SiO_2 + 4NO_2\uparrow + 2H_2O \quad (1)$$

$$SiO_2 + 4HF[[\uparrow]] \rightarrow RSiF_4\uparrow 2H_2O \quad (2)$$

The reactions in (1) and (2) above can be accelerated by exhausting the $SiF_4$ as the etching gas is supplied.

With a conventional method, solid diammonium silicon hexafluoride $((NH_4)2SiF_6)$ was produced by the following reaction (3), in which the tiny amount of $NH_3$ gas generated from the $HNO_3$ gas reacted with the HF gas (the etching gas) and the $SiF_4$ gas produced in reaction (2).

$$SiF_4[[\uparrow]] + 2HF[[\uparrow]] + 2NH_3[[\uparrow]] \rightarrow (NH_4)_2SiF_6 \quad (3)$$

With a conventional method, the above-mentioned reaction (3) occurred because the gas produced by the initial reactions remained in the reaction vessel 1. With the present invention, the reactions (1) and (2) are accelerated by exhausting the $SiF_4$ while the $N_2$ gas is introduced and exhausted, which keeps the production of $(NH_4)_2SiF_6$ by reaction (3) to a minimum, so that substantially all of the decomposition residue following the reaction becomes the metal impurity salt to be analyzed.

Furthermore, it is possible to increase the etching rate by adding sulfuric acid to the mixed solution, which suppresses the supply of water into the chamber by the dehydrating action of the sulfuric acid, and increases the supply of HF gas and $HNO_3$ gas into the chamber by the following reaction (4).

$$H_2SO_4 + 4H_2O \rightarrow H_2SO_4.4(H_2O) \quad (4)$$

The effect of the above is that the etching gas can be supplied in a precise constant amount, it is possible to control the amount of etching of the silicon wafer by controlling the $N_2$ gas, and etching within a range of 0.02 to 10.0 μm can be accomplished.

Also, with the present invention, the amount of silicon remaining in the decomposition residue on the silicon wafer surface can be kept extremely small. As a result, the desired analysis can be performed right away, without having to perform a chemical treatment for sublimating away the silicon during concentration, which was necessary in the conventional analysis of decomposition residue.

According to the present invention, the smoothness of the etched silicon wafer surface was a CV of 5 to 10% in 69-point measurement of a 20 mm square in-plane portion of an 8-inch wafer as shown in the example (FIG. 5) involving ADE measurement, thus the etching could be preferably performed. The surface roughness is as shown in the example (FIG. 7) involving AFM measurement, and was no more than 10% of the etching amount. Etching of 0.2 μm was excluded because the surface roughness was the same as the inherent surface roughness of the wafer.

As discussed above, etching as in the present invention results in excellent smoothness of the etched silicon wafer surface, so the mixed solution of hydrofluoric acid and hydrogen peroxide used as the solution of the recovery means can be used in a smaller amount, such as 50 to 150 μL.

Thus reducing the recovery solution to an amount of 50 to 150 μL also reduces the amount of liquid involved in concentration, and a smaller amount of recovered liquid allows the liquid to be concentrated on a hot plate in only 10 to 20 minutes. The advantage here is that there is less contamination from the chemical liquid and from the atmosphere during concentration.

In the present invention, if the mixed solution is a mixture of hydrofluoric acid and nitric acid, it is preferable for the nitric acid to be used in an amount of 0.351 to 2.805 mol per mole of hydrofluoric acid. Specifically, the etching reaction will not proceed on the wafer surface if the amount is less than 0.351 mol, but the etching rate will drop sharply if 2.805-mol is exceeded.

In the present invention, if the mixed solution is a mixture of hydrofluoric acid, nitric acid, and sulfuric acid, it is preferable for the nitric acid to be used in an amount of 0.351 to 2.805 mol, and the sulfuric acid 0.163 to 0.490 mol, per mole of hydrofluoric acid. The relationship between hydrofluoric acid and nitric acid was described above, but if the amount of sulfuric acid is less than 0.163 mol per mole of hydrofluoric acid, the etching rate will be the same as with a mixed solution of hydrofluoric acid and nitric acid, and no increase in this rate can be expected, but exceeding 0.490 mol is also undesirable because there will be more variance in the in-plane etching of the wafer.

In the present invention, it is preferable for the cooling temperature of the silicon wafer to be 0 to 20° C. Condensation will be uneven and there will be more variance in the in-plane etching of the wafer below 0° C., but exceeding 20° C. is also undesirable because condensation will be difficult and the etching rate will drop.

In the cooling of the silicon wafer, cooling just the portion to be analyzed, such as just the outer periphery or just the middle part of the wafer, allows the etching liquid to be condensed only where needed, which in turn allows just the portion to be analyzed to be selectively etched.

Figure 9:
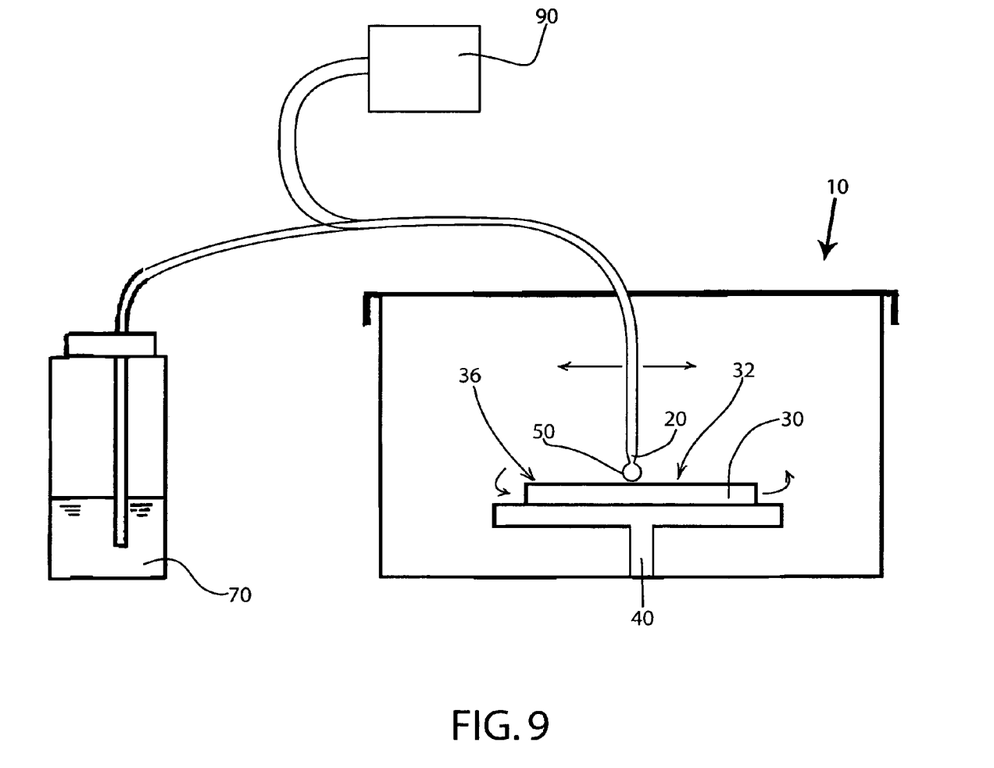
FIG. 9 is a diagram illustrating a simplified structure for the recovery apparatus used in the present invention.

The recovery process for recovery of the decomposition residue for analysis of a silicon wafer that has been selectively etched can be limited to those portions of the wafer that have been etched. For example, and as illustrated in FIG. 9, after the silicon wafer has been selectively etched, the entire wafer is set on a rotator 40 inside a chamber 10. A droplet 50 of a mixed solution of 10% hydrofluoric acid and 25% aqueous hydrogen peroxide is kept between a nozzle 20 and the wafer 30 surface. The nozzle 20 is used to both supply the solution 70 and, during recovery, to recover the decomposition residue. The wafer 30 is then rotated by the rotator 40. As the wafer 30 rotates, the nozzle 20 is moved from the central portion 32 of the wafer 30 towards its outer edge 36 as a droplet 50 of the solution 70 is maintained between the nozzle 20 and the wafer 30 surface. The nozzle 20 is moved so that it passes over essentially only the portion of the wafer 30 that has been etched. In the case wherein the etching has been limited to the center portion 32 of the wafer 30, for example, the nozzle 20 is moved from the center of the wafer towards the outer edge and stops after passing over the etched portion. Therefore, the solution 70 is applied to essentially only the portion of the surface the wafer 30 that has been etched. Thus, consumption of solution is further reduced because the area to which the solution is applied is limited to the etched portion of the wafer. After the solution has been applied to the etched portion of the surface of the wafer, a vacuum 90 is applied to the nozzle 20 to provide suction and the nozzle 20 is moved back to the center of the wafer surface as the wafer rotates so that the solution and decomposition residue produced by the etching reaction are recovered.

The etching method and analysis method pertaining to the present invention are not limited to a CZ wafer or epitaxial wafer, and a SIMOX wafer or an SOI wafer (laminated wafer) can also be analyzed, and these methods are also effective in the analysis of depth profiles of metal impurities.

EXAMPLES

Example 1

Using the silicon wafer etching apparatus shown in FIG. 1, the silicon wafer 3, which had been quantitatively contaminated (2 ng) with a standard solution of Fe—Ni—Cu, was placed on the stage 4 in the reaction vessel 1, and the stage 4 and the silicon wafer 3 were cooled to 10° C. with the cooling apparatus 5.

Meanwhile, the solution 7, which consisted of 100 mL of a 50% hydrofluoric acid solution and 200 mL of a 68% nitric acid solution, was put in the etching chemical container 6, $N_2$ gas was passed through as a carrier gas at a rate of 1 L/min, and exhaust was performed at 100 hPa.

Various holding times were tested in this etching gas introduction and exhaust state. After this, just $N_2$ gas was allowed into the reaction vessel 1 for 15 minutes to replace the system with $N_2$ gas, after which the lid 2 was opened and the silicon wafer 3 was taken out, and the amount of etching was measured.

Figure 2A:
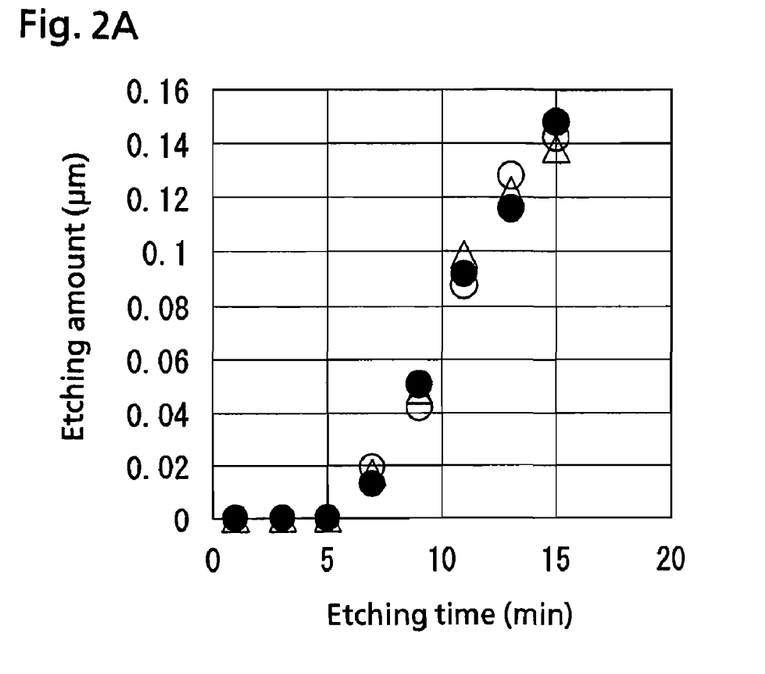
FIGS. 2A and 2B are graphs of the relation between silicon wafer etching time and etching amount, measured using a mixed solution of hydrofluoric acid and nitric acid.
Figure 2B:
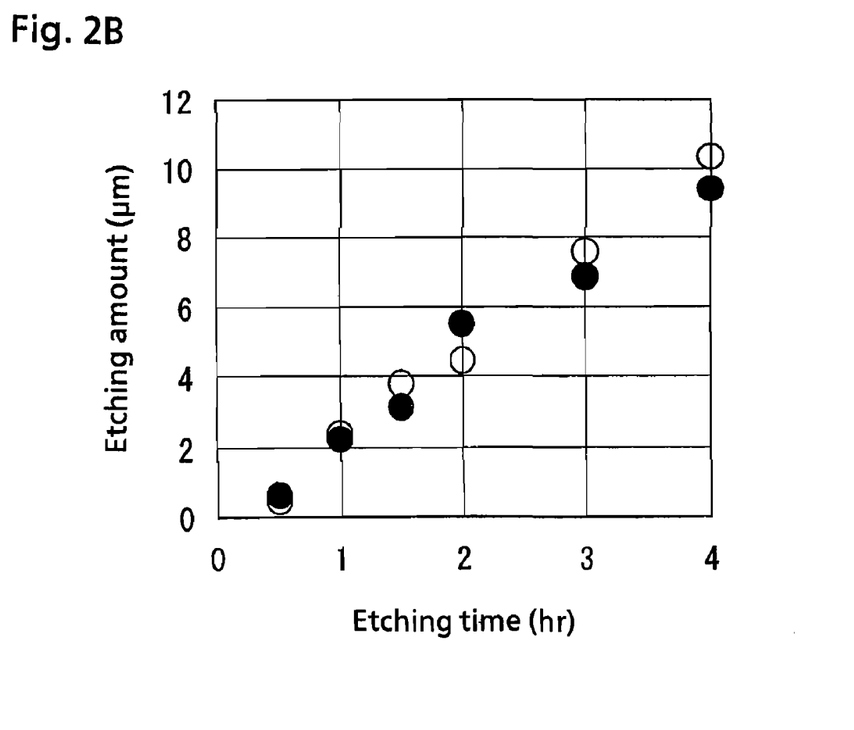

FIGS. 2A and 2B show the relation between the amount of etching and the etching time of three silicon wafers (indicated in the graphs as white circles, white triangles, and black circles; the same applies hereinafter), measured using a mixed solution of hydrofluoric acid and nitric acid. It is clear from FIGS. 2A and 2B that with the present invention, because a specific amount of etching gas is introduced while the reaction vessel 1 was exhausted, the amount of gas introduced can be controlled, there is an accurate, positive correlation between etching time and etching amount, and the amount of etching can be accurately controlled over a range of 0.02 to 10.0 μm.

Figure 3:
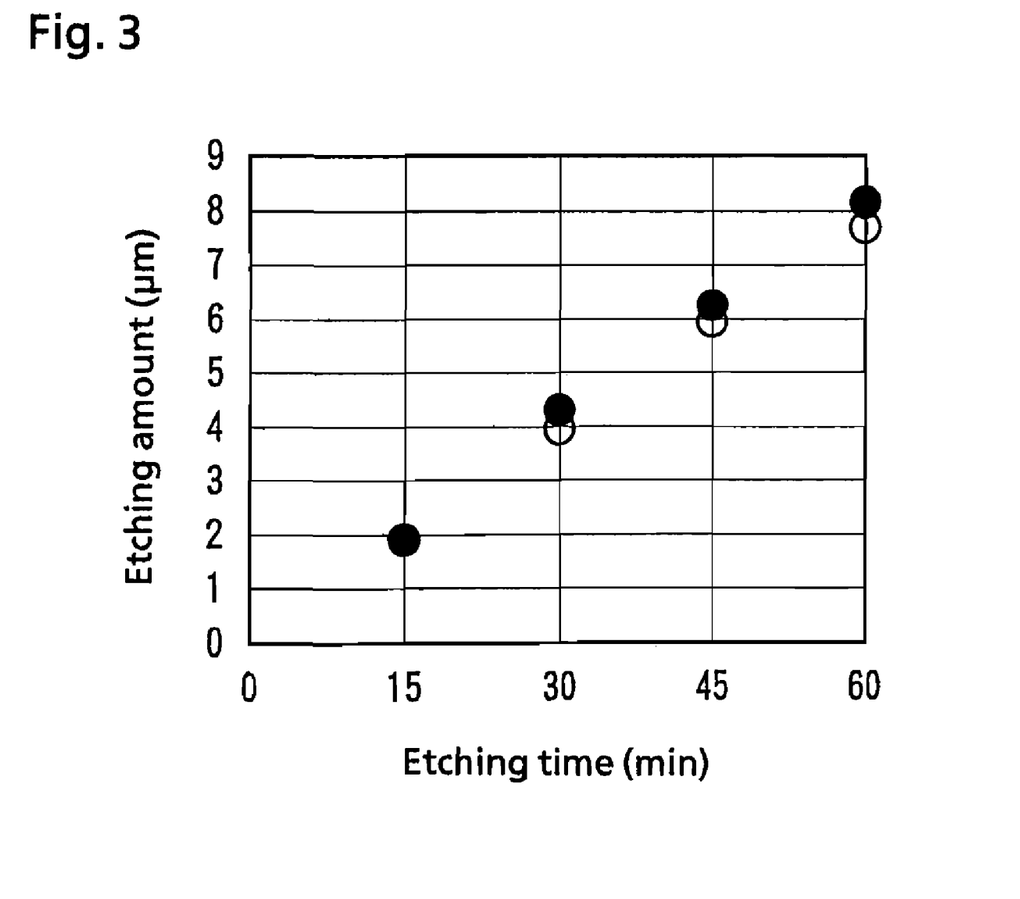
FIG. 3 is a graph of the relation between silicon wafer etching time and etching amount, measured using a mixed solution of hydrofluoric acid, nitric acid, and sulfuric acid.

FIG. 3 shows the relation between the amount of etching and the etching time, measured using a mixed solution of hydrofluoric acid, nitric acid, and sulfuric acid. The etching rate here is about four times that with the mixed solution of just hydrofluoric acid and nitric acid, and it is clear that the etching rate is greatly increased.

Example 2

The various silicon wafers before and after the etching performed for various holding times in Example 1 were measured for thickness (ADE measurement), and the in-plane distribution of the amount of etching of the wafer during etching was examined.

Figure 4:
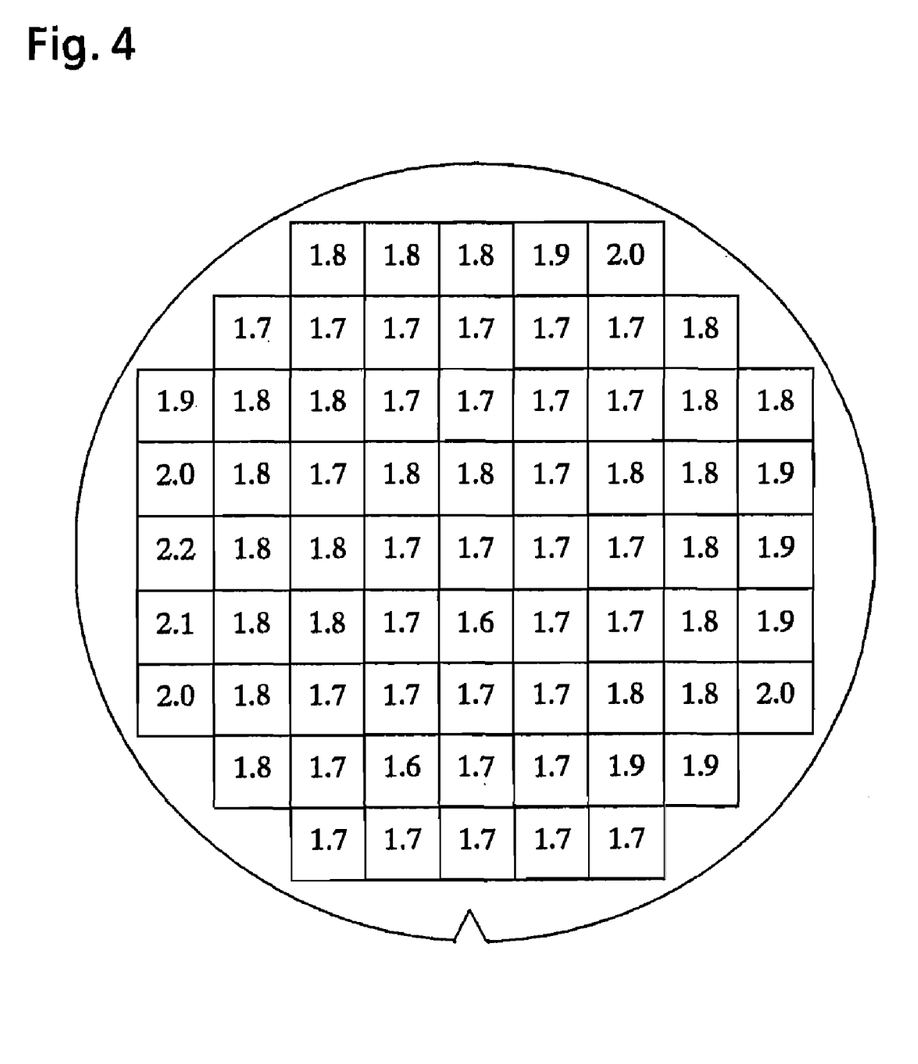
FIG. 4 is a diagram illustrating the silicon wafer in-plane etching amount distribution, measured by ADE.
Figure 5:
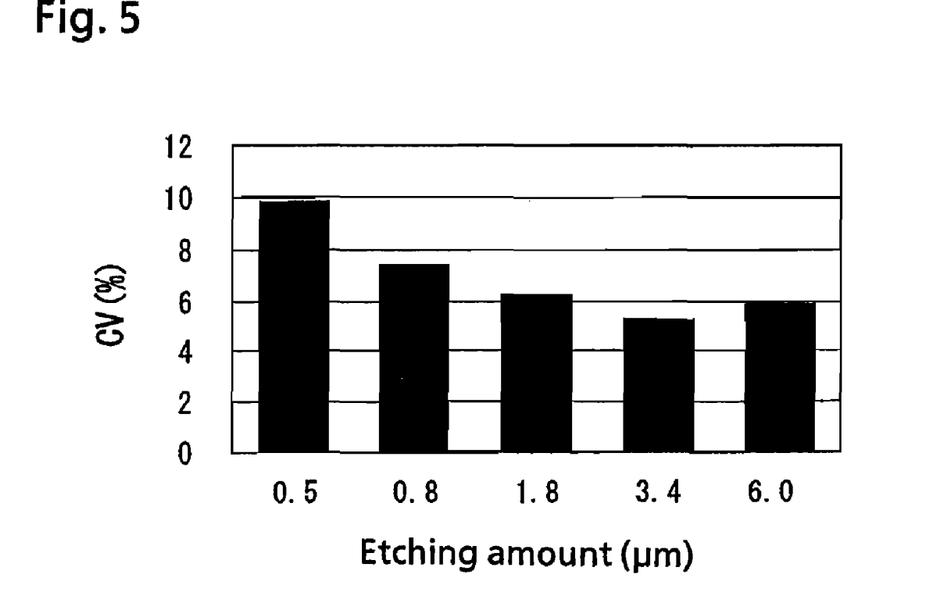
FIG. 5 is a graph of the silicon wafer etching amount and the in-plane uniformity (CV %) of the etching amount measured by ADE.

FIG. 4 shows the wafer in-plane etching amount distribution, and FIG. 5 shows the etching amount and the in-plane uniformity (CV %) of the etching amount. As a result, it can be seen that the wafer in-plane etching uniformity was good (a CV % of no more than 10%) for all wafers.

Figure 6:
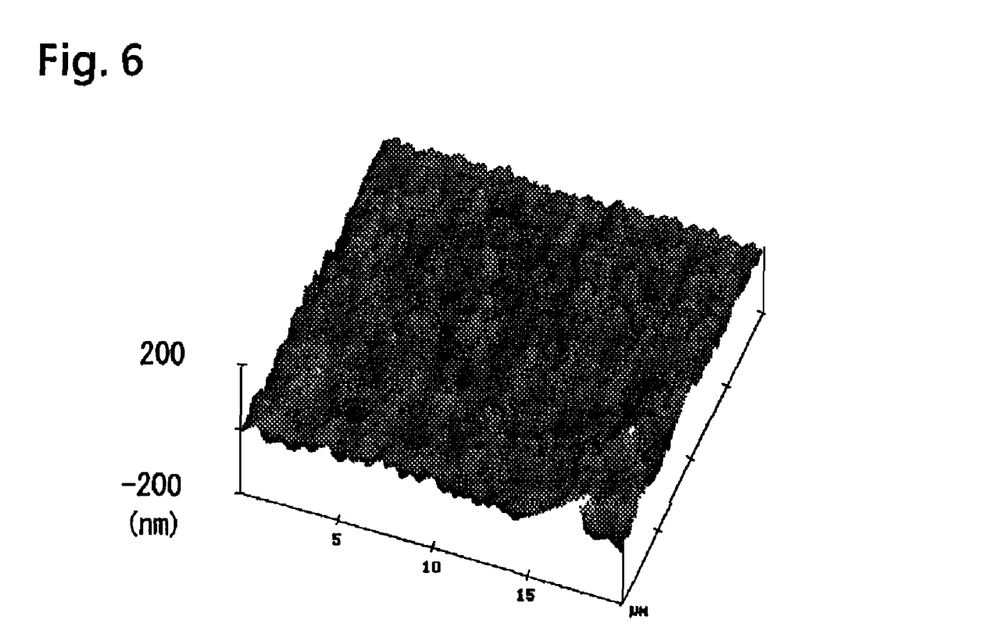
FIG. 6 is an oblique view of an image produced by AFM measurement of a silicon wafer that has been etched to a depth of 0.2 µm.
Figure 7:
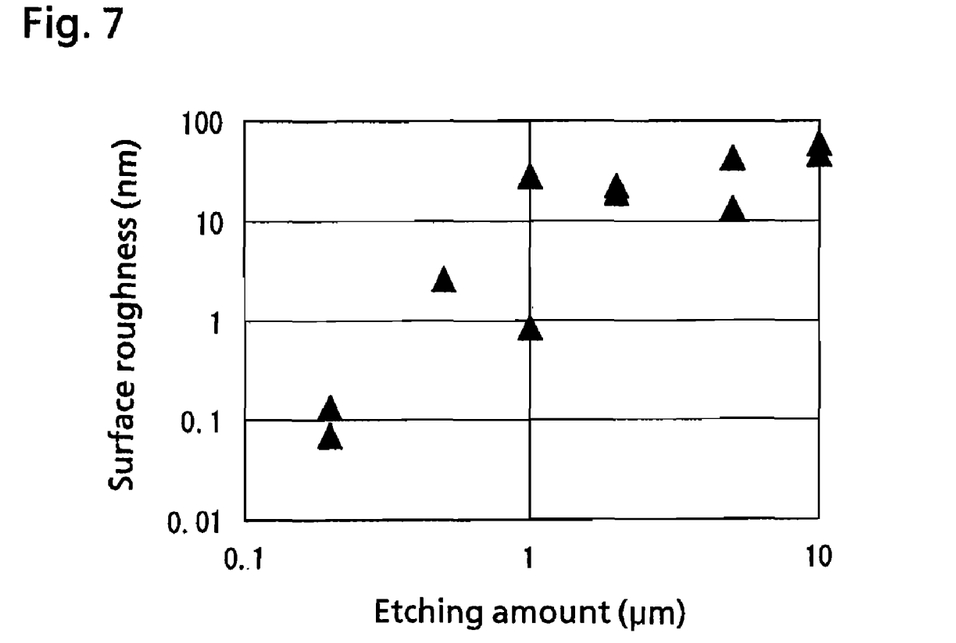
FIG. 7 is a graph of the silicon wafer etching amount and the surface roughness measured by AFM.

The surface roughness after etching was also examined by AFM measurement. FIG. 6 shows an image produced by AFM measurement of a wafer that has been etched by 0.2 μm. FIG. 7 is a graph of the wafer etching amount and the surface roughness. As a result, it can be seen that the surface roughness was good, since the Rms is no more than 10% of the etching amount at all etching amounts.

In Example 1, etching (2 μm) was performed by holding for 1 hour. Then the entire silicon wafer is set on a rotator. A droplet of a mixed solution of 10% hydrofluoric acid and 25% aqueous hydrogen peroxide is kept between a nozzle and the wafer surface. The nozzle is used to both supply the solution and, during recovery, to recover the decomposition residue. The wafer is then rotated by the rotator. As the wafer rotates, the nozzle is moved from the center of the wafer to its outer edge as a droplet of the solution is maintained between the nozzle and the wafer surface. Therefore, the solution is applied all over the surface the wafer. During this process consumption of solution is very small, as little as 100 μL. After the solution has been applied all over the surface of the wafer, a vacuum is applied to the nozzle to provide suction and the nozzle is moved from the outer edge to the center of the wafer surface as the wafer rotates so that the solution and decomposition residue produced by the etching reaction are recovered.

This recovered solution was concentrated for 15 minutes at 220° C. on a hot plate, and dried until solid. No chemicals (hydrofluoric acid, nitric acid, or sulfuric acid) were used during the concentration step.

Figure 8:
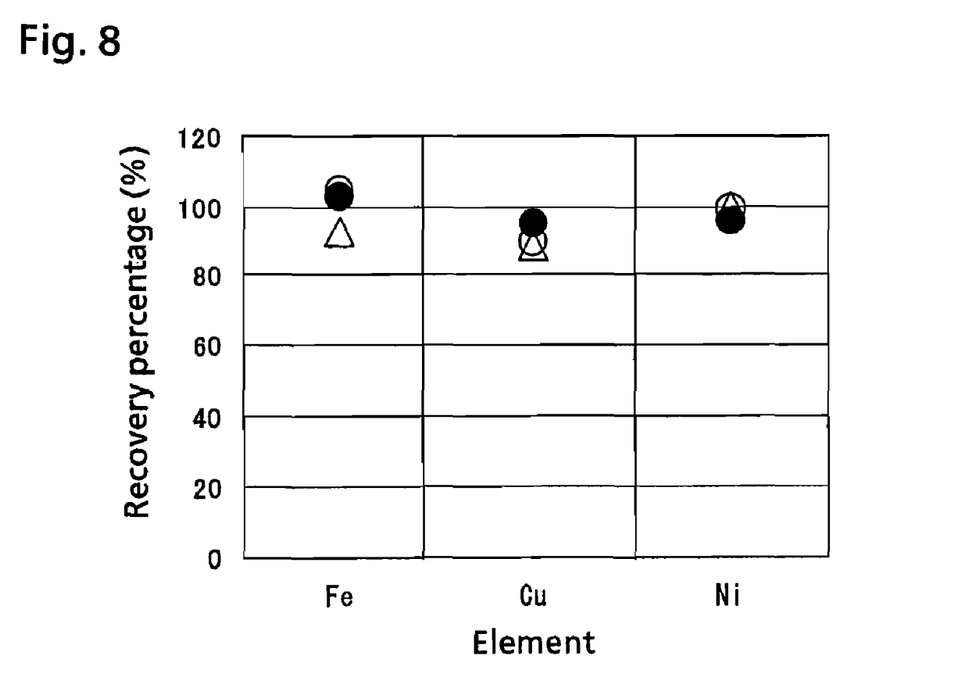
FIG. 8 is a graph of the metal impurity recovery percentage in the 2 µm etching of a silicon wafer that has been quantitatively contaminated (2 ng)

1 mL of a 0.2% nitric acid solution was added to the dried and solidified sample, and ICP/MS-ETV analysis was performed, which gave detection values of about 100% the known contamination amounts of the various elements shown in FIG. 8. It is clear from these results that the present invention allows the metal impurity concentration on a wafer surface to be analyzed to a high degree of sensitivity.

INDUSTRIAL APPLICABILITY

With the present invention, the flux of an etching gas introduced into a reaction vessel can be controlled very precisely, which makes it possible to keep the etching amount within a range of 0.02 to 10.0 μm, and a silicon wafer can be etched with excellent in-plane etching uniformity and without any contamination, only a small amount of solution is used to recover the decomposition residue, concentration can be completed in a short time without contamination, there is no effect on ICP-MS analysis, and high-sensitivity and high-precision evaluation is possible.

Also, with the present invention, in the cooling of the silicon wafer, just the portion to be analyzed can be cooled, so the etching liquid can be condensed just on this cooled portion, and just the portion to be analyzed can be selectively etched, allowing the decomposition residue to be recovered and the impurities analyzed for just this portion.

What is claimed is:

1. A method for analyzing impurities of a silicon wafer, the method comprising the steps of:
    applying a carrier gas through a mixed solution of hydrofluoric acid and nitric acid or of hydrofluoric acid, nitric acid and sulfuric acid to obtain an etching gas;
    introducing the etching gas obtained by bubbling and containing vaporized hydrofluoric acid and nitric acid into a vessel equipped with an inlet and an outlet;
    cooling said vessel to a specific temperature, wherein the etching gas is condensed on the surface of a silicon wafer that is held inside said vessel and that has been cooled, thereby etching said surface;
    recovering any decomposition residue by maintaining a droplet of mixed solution of hydrofluoric acid and aqueous hydrogen peroxide between a nozzle and the wafer and moving the nozzle to apply the solution on the wafer, then applying suction to the nozzle and moving the nozzle for recovery by suction of the solution with the residue; and analyzing said residue.

2. The method for analyzing impurities of a silicon wafer according to claim 1, wherein the mixed solution comprises hydrofluoric acid and nitric acid, and the nitric acid is used in an amount of 0.351 to 2.805 mol per mole of hydrofluoric acid.

3. The method for analyzing impurities of a silicon wafer according to claim 1, wherein the mixed solution comprises hydrofluoric acid, nitric acid, and sulfuric acid, and the nitric acid is used in an amount of 0.351 to 2.805 mol and the sulfuric acid in an amount of 0.163 to 0.490 mol per mole of hydrofluoric acid.

4. The method for analyzing impurities of a silicon wafer according to claim 1, wherein the cooling temperature of the silicon wafer is 0 to 20° C.

5. The method for analyzing impurities of a silicon wafer according to claim 1, wherein the cooled portion of the silicon wafer is the entire wafer, the outer periphery of the wafer, the middle part of the wafer, or a specific part of the wafer.

6. The method for analyzing impurities of a silicon wafer according to claim 1, wherein the amount of etching is 0.02 to 10.0 µm.

7. The method for analyzing impurities of a silicon wafer according to claim 1, wherein the cooled portion of the silicon wafer is limited to a specific part of the wafer such that the etching gas is condensed on the surface of the silicon wafer limited to the specific part that is cooled.

8. The method for analyzing impurities of a silicon wafer according to claim 7, wherein the nozzle is moved to apply the solution to the surface of the silicon wafer limited to the specific part that is cooled, and then moved to recover the solution.

9. A method for analyzing impurities of a silicon wafer, the method comprising the steps of:

generating an etching gas by bubbling a carrier gas through a mixed solution containing hydrofluoric acid and nitric acid;

introducing the etching gas containing vaporized hydrofluoric acid and nitric acid into a vessel having a system for introducing and exhausting the etching gas, wherein the etching gas is condensed on a surface of a cooled silicon wafer held inside said vessel, thereby etching said surface;

recovering any decomposition residue by maintaining a droplet of mixed solution of hydrofluoric acid and aqueous hydrogen peroxide between a nozzle and the wafer and moving the nozzle to apply the solution on the wafer, then applying suction to the nozzle and moving the nozzle for recovery by suction of the solution with the residue; and concentrating the recovered mixed solution and analyzing said solution for metal impurities.

10. The method for analyzing impurities of a silicon wafer according to claim 9, wherein the mixed solution of hydrofluoric acid and aqueous hydrogen peroxide is used in an amount of 50 to 150 µL.

* * * * *